United States Patent
Yamagishi et al.

(10) Patent No.: US 10,111,378 B2
(45) Date of Patent: Oct. 30, 2018

(54) ELECTRIC LAWN MOWER CONTROL APPARATUS

(71) Applicant: Honda Motor Co., Ltd., Tokyo (JP)

(72) Inventors: Yoshihiko Yamagishi, Wako (JP); Toru Yuki, Wako (JP); Shinsaku Nakayama, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/610,900

(22) Filed: Jun. 1, 2017

(65) Prior Publication Data

US 2017/0354087 A1  Dec. 14, 2017

(30) Foreign Application Priority Data

Jun. 13, 2016 (JP) ................. 2016-117199

(51) Int. Cl.
*A01D 34/00* (2006.01)
*A01D 34/58* (2006.01)
(Continued)

(52) U.S. Cl.
CPC ....... *A01D 34/006* (2013.01); *A01D 34/6806* (2013.01); *A01D 34/78* (2013.01); *A01D 34/82* (2013.01); *B60L 7/14* (2013.01); *G01R 31/3606* (2013.01); *H01M 10/0525* (2013.01); *H01M 10/44* (2013.01); *H01M 10/486* (2013.01);
(Continued)

(58) Field of Classification Search
CPC .. A01D 34/6812; A01D 34/78; A01D 34/008; A01D 34/6806; A01D 34/001; A01D 34/006; A01D 69/02; A01D 69/025; A01D 34/82; B60L 7/14; G01R 31/3606; H02J 7/0068; H02J 7/1438; H02K 21/222; H02K 9/06; H02K 7/102; H02K 7/02; H02K 7/1815; H02K 1/30; H02K 1/32; H01M 10/0525; H01M 10/44; H01M 10/486; H02P 1/029; H02P 4/00;
(Continued)

(56) References Cited

U.S. PATENT DOCUMENTS 5,727,372 A * 3/1998 Kanitz ................ A01D 34/78
56/11.9
6,170,241 B1 * 1/2001 Shibilski ............. H02H 7/0833
318/434

(Continued)

FOREIGN PATENT DOCUMENTS

JP  2013207976 A  10/2013

*Primary Examiner* — Robert E Pezzuto
(74) *Attorney, Agent, or Firm* — Duft & Bornsen, PC

(57) ABSTRACT

In a control apparatus of a walk-behind electric lawn mower equipped with an electric motor, a blade cutter connected to the electric motor, a rechargeable battery connected to the electric motor, a motor driver circuit to adjust supply of operating electric power to the electric motor, ON/OFF of a first switching element disposed in a current path connecting the battery and the electric motor and a second switching element interposed in the current path in series with a braking resistor to allow charge current from the electric motor to the braking resistor, wherein operation of the first and second switching elements are controlled based on detected battery temperature and internal voltage of the motor driver circuit.

10 Claims, 3 Drawing Sheets

(51) Int. Cl.
*A01D 34/78* (2006.01)
*A01D 34/68* (2006.01)
*A01D 34/82* (2006.01)
*G01R 31/36* (2006.01)
*H01M 10/0525* (2010.01)
*H01M 10/44* (2006.01)
*H01M 10/48* (2006.01)
*H02J 7/00* (2006.01)
*H02J 7/14* (2006.01)
*H02P 27/08* (2006.01)
*B60L 7/14* (2006.01)
*A01D 101/00* (2006.01)

(52) U.S. Cl.
CPC .......... *H02J 7/0068* (2013.01); *H02J 7/1438* (2013.01); *H02P 27/08* (2013.01); *A01D 2101/00* (2013.01); *H01M 2220/20* (2013.01)

(58) Field of Classification Search
CPC .......... H02P 7/285; H02P 7/29; H02P 7/2913; H02P 27/08
USPC .......... 56/10.1, 10.2 A–10.2 G, 10.2 R, 10.8, 56/11.1, 16.7; 318/434, 440, 599, 430, 318/432, 139, 809, 811
See application file for complete search history.

(56) References Cited

U.S. PATENT DOCUMENTS

| | | | |
|---|---|---|---|
| 6,750,622 B2* | 6/2004 | Simizu | A01D 34/006 318/139 |
| 6,987,328 B2* | 1/2006 | Osborne | A01D 34/6806 290/1 A |
| 7,741,793 B2* | 6/2010 | Lucas | H02P 4/00 318/139 |
| 7,884,560 B2* | 2/2011 | Lucas | A01D 69/025 318/139 |
| 8,552,669 B2* | 10/2013 | Kusakawa | H02P 7/29 318/139 |
| 9,192,096 B2* | 11/2015 | Harris, III | A01D 34/008 |
| 9,787,225 B2* | 10/2017 | Lucas | A01D 69/025 |

* cited by examiner

ELECTRIC LAWN MOWER CONTROL APPARATUS

CROSS-REFERENCE TO RELATED APPLICATIONS

This application is based upon and claims the benefit of priority from Japanese Patent Application No. 2016-117199 filed on Jun. 13, 2016, the contents of which are incorporated herein by reference.

BACKGROUND OF THE INVENTION

Field of the Invention

This invention relates to an electric lawn mower control apparatus, particularly to an apparatus for controlling operation of a walk-behind electric lawn mower movable over a lawn growth area hand-pushed by a user.

Description of Related Art

A walk-behind electric lawn mower of this type ordinarily comprises an electric motor mounted on a frame hand-pushed by a user and supplied with operating electric power from a rechargeable battery and is constituted to cut lawn or grass by rotationally driving a blade cutter installed on the undersurface of the frame using the electric motor.

Although the rechargeable battery is charged by regenerative electric current generated by the electric motor during braking of the blade cutter rotation, in a case where the rechargeable battery is a high-energy-density lithium-ion battery or the like, its characteristics are liable to be degraded when charged at low temperature or at high voltage.

In light of the problem of structural complexity caused by the conventional measure of temporarily storing regenerated electric power in an electric double layer capacitor of higher energy density than the rechargeable battery, Japanese Unexamined Patent Publication No. 2013-207976 proposes a power regeneration system that is equipped with a main battery for supplying electric power to the electric motor and an auxiliary battery set to a lower charging voltage than that of the main battery and that is adapted to store regenerative electric power generated by the electric motor during regenerative braking in the auxiliary battery.

The teaching of the reference achieves a compact and low-cost configuration, but in the case of a walk-behind electric lawn mower like that of this intention, addition of an auxiliary battery as in the reference is undesirable because priority is on structural simplicity.

SUMMARY OF THE INVENTION

Therefore, the object of this invention is to overcome the aforesaid problem by providing a control apparatus for a walk-behind electric lawn mower comprising an electric motor driven by a rechargeable battery subject to charging constraints and adapted to avoid hindrance to charging of the rechargeable battery.

In order to achieve the object, this invention provides a control apparatus of a walk-behind electric lawn mower equipped with an electric motor, a blade cutter connected to the electric motor, a rechargeable battery connected to the electric motor, a motor driver circuit to adjust supply of operating electric power to the electric motor. In the apparatus, ON/OFF of a first switching element disposed in a current path connecting the battery and the electric motor and a second switching element interposed in the current path in series with a resistor to allow charge current from the electric motor to the resistor, wherein operation of the first and second switching elements are controlled based on detected battery temperature and internal voltage of the motor driver circuit.

BRIEF DESCRIPTION OF THE DRAWINGS

The above and other objects and advantages will be more apparent from the following description and drawings, in which.

DETAILED DESCRIPTION OF THE INVENTION

In the following, an electric lawn mower control apparatus according to an embodiment of this invention is explained with reference to the attached drawings.

Figure 1:
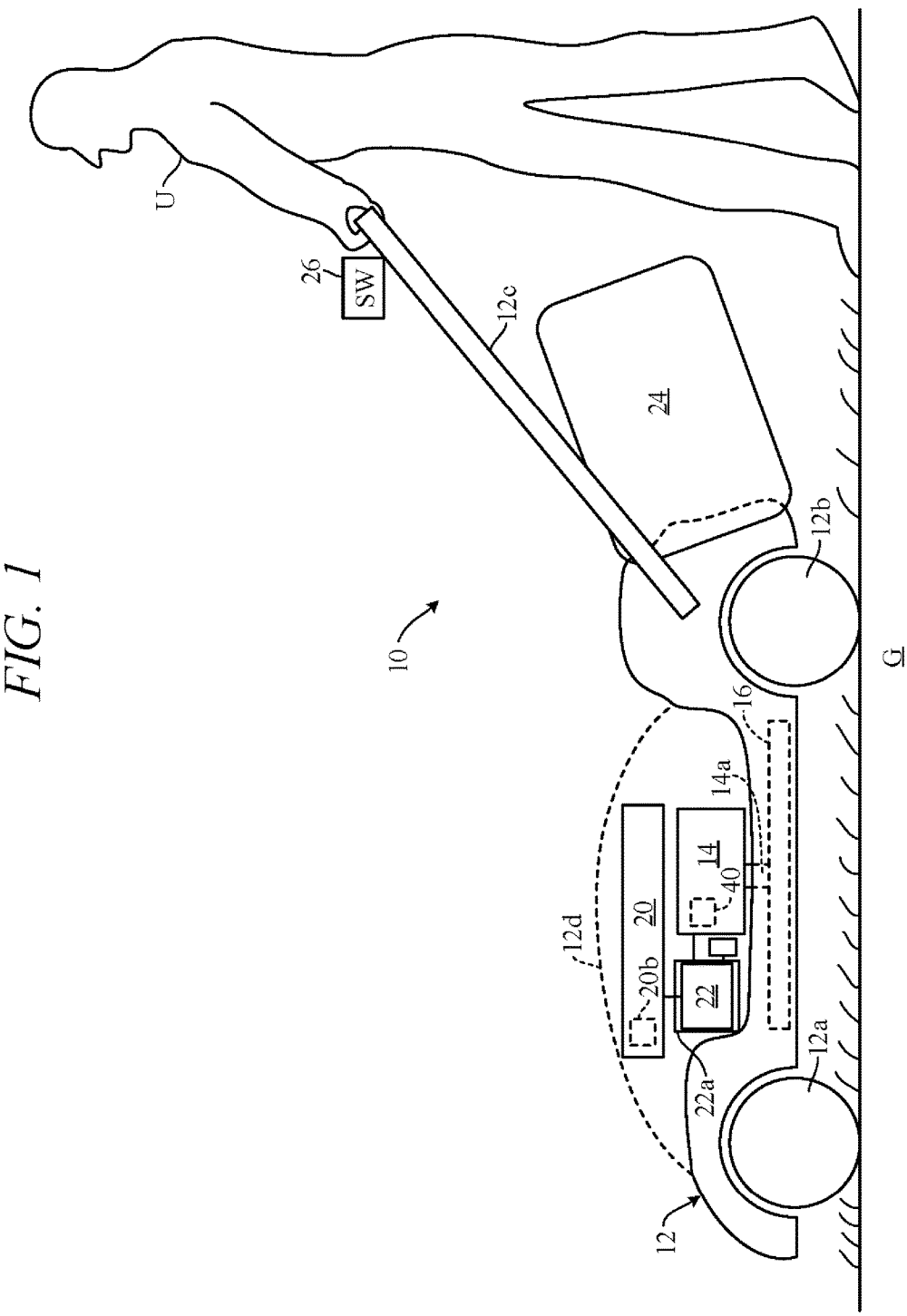
FIG. 1 is a schematic diagram generally illustrating an electric lawn mower control apparatus according to this invention.

FIG. 1 is a schematic diagram generally illustrating the electric lawn mower control apparatus according to this invention.

In FIG. 1, reference symbol 10 designates an electric lawn mower (hereinafter called "lawn mower") equipped with a frame 12. The frame 12 is provided thereon with an electric motor (hereinafter called "motor") 14, a blade cutter 16, a rechargeable battery (hereinafter called "battery") 20, and an electronic circuit board 22 accommodated in a case 22a.

The battery 20 is a lithium-ion battery or other such chargeable battery having a high energy density compared to that of the common lead battery. The battery 20 is charged by regenerative electric current generated by the electric motor 14 during braking of rotation of the blade cutter 16.

The frame 12, which is shaped like a car body as illustrated, is equipped on the bottom with pairs of front wheels 12a and rear wheels 12b (only those on near side shown) and provided with a handle 12c, and is adapted to be movable over a lawn growth area G by a user U pushing the handle 12c by hand from behind.

The motor 14 is located near the center of the frame 12. Although not illustrated, the undersurface of the frame 12 is cut out in circular shape at the location of the motor 14 to form a hollow cylindrically shaped cutter chamber, and the blade cutter 16 (and a blower (not shown)) are rotatably housed therein. The top of the frame 12 is covered by a cover 12d.

The blade cutter 16 and blower are connected to an output shaft 14a of the motor 14 and configured to cut grass on the lawn growth area G when the blade cutter 16 is rotationally driven by the motor 14. The blower blows grass clippings toward a discharge outlet (not shown) and from there rearward to be collected in a grass bag 24 attached to the back end of the frame 12. A switch (SW) 26 the user U can operate to input start and stop instructions to the motor 14 is provided near the handle 12c.

Figure 2:
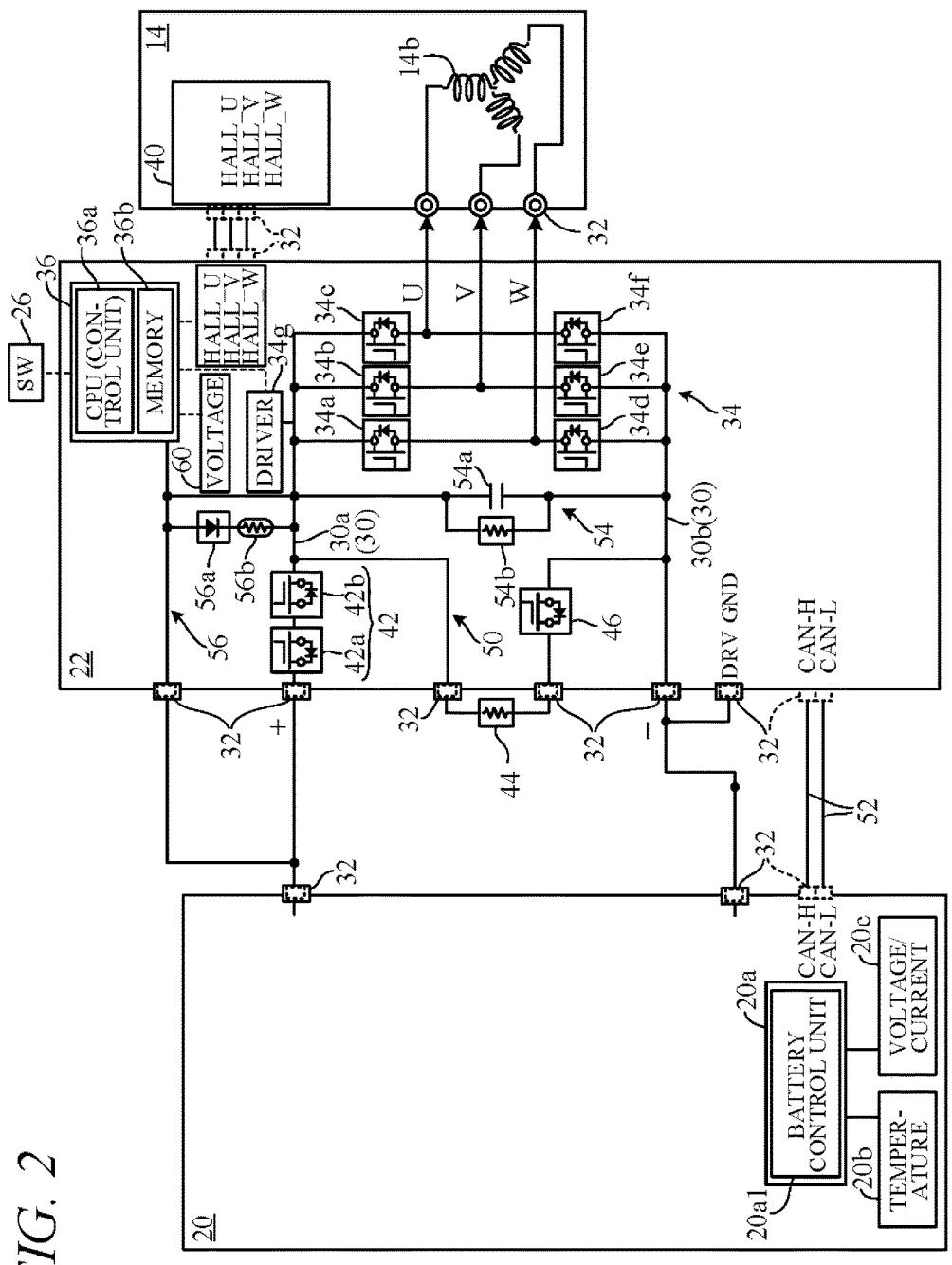
FIG. 2 is a block diagram showing electrical connective relationship among constituent components of the apparatus of FIG. 1.

FIG. 2 is a block diagram showing electrical connective relationship among constituent components of the apparatus of FIG. 1.

As illustrated, a current path 30 connecting the battery 20 and the motor 14 is formed on an electronic circuit board 22. The current path 30 comprises a positive side current path 30a and a negative side current path 30b. Symbols 32 in FIG. 2 indicate terminals.

A motor driver circuit (hereinafter called "driver circuit") 34 for adjusting supply of operating electric power to the motor 14 is connected to the current path 30. Specifically, the driver circuit 34 is connected between the positive side current path 30a and the negative side current path 30b.

The motor 14 is a three-phase brushless DC motor of multipolar outer structure comprising on the outside, for example, a flywheel-type rotor having multiple sets of permanent magnets arranged on an inner peripheral surface and on the inside opposing the same a rotor having multiple projections wound with U, V and W three-phase coils 14b arranged at 120° intervals.

The driver circuit 34 is more exactly an inverter circuit comprising multiple sets of bridge-connected gate elements, namely, six gate elements 34a, 34b, 34c, 34d, 34e and 34f constituted of insulated-gate FETs and parasitic diodes, three on the positive side and three on the negative side, and a driver 34g for outputting drive voltage to and adjusting operation of the gates of the six gate elements.

An ECU (Electronic Control Unit) 36 comprises a microcomputer having at least one CPU (processor) 36a and a memory 36b coupled to the CPU 36b, wherein the CPU 36a is configured to control operation of the driver circuit 34, i.e., configured to perform as a control unit (control means) that controls operation of the driver circuit 34 through the driver 34g implemented on the electronic circuit board 22. The ECU 36 is supplied operating electric power from the current path 30.

Specifically, the ECU 36, more precisely the CPU (control unit) 36a responds to an instruction to start the motor 14 inputted by the user U through the switch 26 by PWM-controlling operation of the driver 34g so as to apply discharge power of the battery 20 discharged through the current path 30 as operating electric power sequentially in order of phase to the gates of the six gate elements 34a to 34f respectively connected to the U, V and W coils, thereby rotating the motor 14.

Further, the ECU 36, i.e., the CPU (control unit) 36a responds to an instruction to stop the motor 14 inputted by the user U through the switch 26 by driving the respective gate elements at times matched to sequential generation of induced electromotive voltage in the U, V and W phases so as to perform regeneration that drives the three-phase coils 14b to generate regenerative electric current during braking of rotation of the blade cutter 16. The so-generated regenerative electric current is supplied to the battery 20 as regenerative electric current through the current path 30, specifically through the positive side current path 30a and negative side current path 30b.

Three Hall element sensors 40 are disposed in the motor 14 and generate outputs in accordance with position of the rotor and rotational speed of the motor 14. The outputs of the Hall element sensors 40 are inputted to the electronic circuit board 22 and sent to the ECU 36. The ECU 36, more precisely the CPU (control unit) 36a controls the operation of the driver 34g in the foregoing manner based thereon.

The current path 30, specifically its positive side current path 30a, incorporates two switching elements 42 in series connection, namely a charge switching element (first switching element) 42a and a discharge switching element 42b, both constituted of insulated-gate FETs and parasitic diodes similarly to the gate elements of the driver circuit 34.

Passage of charge current from the motor 14 to the battery 20 is allowed when the charge switching element 42a is turned ON and blocked when it is turned OFF. Passage of discharge current from the battery 20 to the motor 14 is allowed when the discharge switching element 42b is turned ON and blocked when it is turned OFF.

By inserting the charge switching element 42a that allows passage of charge current from the motor 14 to the battery 20 and the discharge switching element 42b that allows passage of discharge current from the battery 20 to the motor 14 into the current path 30 in series connection in this manner, i.e. so as to establish ON/OFF selectability, charge and discharge can be easily controlled.

Moreover, a braking resistor (resistance; hereinafter referred to as "resistor") 44 is inserted into the current path 30, specifically between the positive side current path 30a and the negative side current path 30b, and a regenerative resistance switching element (second switching element) 46 constituted of an insulated-gate FET and a parasitic diode similarly to the charge switching element 42a is inserted in series with the resistor 44.

The regenerative resistance switching element 46 allows charge current stored in the driver circuit 34 during regeneration by the motor 14 to pass to the resistor 44 when turned ON and blocks the same when turned OFF.

More precisely, the resistor 44 and the regenerative resistance switching element 46 are inserted in a connection circuit 50 that connects a point downstream of the charge switching element 42a/discharge switching element 42b to the negative side current path 30b, and the resistor 44 in the connection circuit 50 is placed outside the electronic circuit board 22 so as to reduce effect of heat generated by current flow.

The battery 20 is equipped with a microcomputer 20a that has a temperature sensor (rechargeable battery temperature detector) 20b configured to produce an output indicating a temperature of the battery 20 and a voltage/current sensor (rechargeable battery residual capacity detector) 20c configured to produce an output indicating a state of charge of the battery 20, i.e., a residual capacity of the battery 20.

The microcomputer 20a has at least one processor (CPU) and a memory and the processor is configured to perform as a battery control unit 20a1 that permits charging of the battery 20 based on the outputs of the sensors 20b and 20c.

The microcomputer 20a of the battery 20 and the electronic circuit board 22 are connected by two (high-level and low-level) CAN (Control Area Network) communication lines 52, by which signals representing detected temperature, residual capacity, discharge permission and the like of the battery 20 are sent from the battery control unit 20a1 to the CPU (control unit) 36a of the ECU 36. Alternatively, whether charging of the battery 20 is permitted can be determined by the ECU 36.

The positive side current path 30a and negative side current path 30b are connected by a second connection circuit 54. The second connection circuit 54 is provided with a smoothing capacitor 54a that by absorbing pulsations smooths regenerative electric current during rectification from alternating current to direct current. A resistor 54b connected in parallel with the smoothing capacitor 54a stabilizes against voltage drops and the like caused by load fluctuation.

In addition, the positive side current path 30a is branched off and the branch is connected to the electronic circuit board 22 through a terminal 32 to form a branch circuit 56 connected to the positive side current path 30a at a location downstream of the charge switching element 42a/discharge switching element 42b.

A diode 56a and a resistor 56b are inserted in the branch circuit 56 in series to function as pre-charge resistance that prevents inrush current from flowing into the smoothing capacitor 54a when the discharge switching element 42b is turned ON.

Further, a voltage sensor (internal circuit voltage detector) 60 constituted of a sensing resistor is provided in a voltage-dividing circuit that divides voltage of the positive side current path 30a and supplies it to the ECU 36 as operating electric power, and the voltage sensor is configured to produce an output indicating an internal circuit voltage of the driver circuit 34 to the ECU 36, i.e., the CPU (control unit) 36a.

Figure 3:
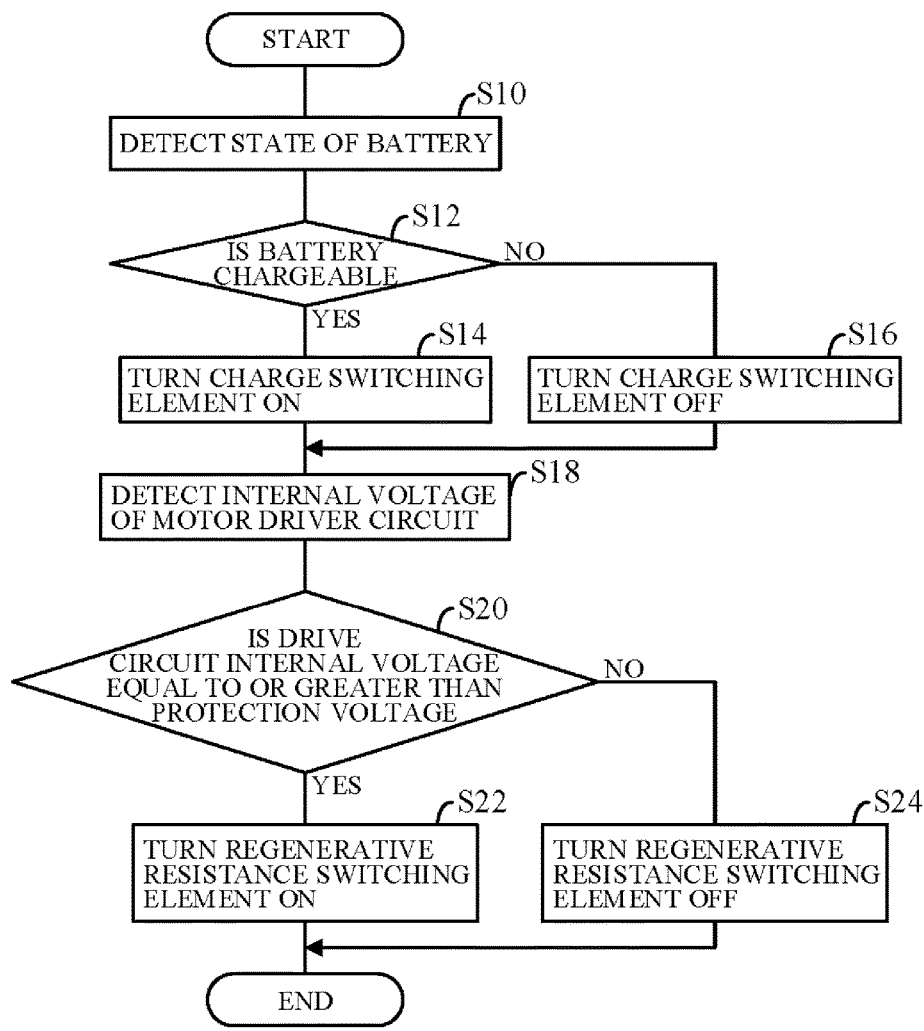
FIG. 3 is a flowchart showing operations of the apparatus of FIG. 1.

FIG. 3 is a flowchart showing operations of the apparatus of FIG. 1 executed by the ECU 36, i.e., the CPU (control unit) 36a.

Now to explain, state of the battery 20 is detected in S10. Specifically, temperature and residual capacity of the battery 20 are detected by the temperature sensor 20b and the voltage/current sensor 20c.

Next, in S12, state of the battery 20 is detected, i.e., chargeability of the battery 20 is determined, more precisely, it is determined whether the battery 20 is chargeable. It is done by determining whether temperature of the battery 20 detected by the temperature sensor 20b is equal to or higher than an appropriately set predetermined temperature.

The determination of chargeability in S12 is made based not only on temperature but also on residual capacity of the battery 20 detected from the output of the voltage/current sensor 20c. Namely, charging allowability is determined in S12 also based on whether detected residual capacity is less than a predetermined capacity.

When the result in S12 is YES, meaning that the detected temperature of the battery 20 is equal to or higher than the predetermined temperature, the program goes to 514, in which the charge switching element 42a is turned ON to allow passage of charge current from the motor 14 to the battery 20.

So, as explained earlier, AC output of the motor 14 is rectified by the parasitic diodes of the gate elements 34a to 34f, whereby generated regenerative electric current is supplied through the current path 30 to the battery 20 as regenerative electric current that charges the battery 20.

On the other hand, when the result in S12 is NO, i.e., when the temperature of the battery 20 is determined to be lower than the predetermined temperature, the program goes to S16, in which the charge switching element 42a is turned OFF to block passage of charge current from the motor 14 to the battery 20. As a result, generated regenerative electric current (more exactly, regenerative energy (electric power)) is stored in the driver circuit 34.

Next, in S18, internal voltage of the driver circuit 34 is detected from the output of the voltage sensor 60, whereafter the program goes to S20 to determine whether the internal voltage of the driver circuit 34 detected from the output of the voltage sensor 60 is equal to or greater than an appropriately set protection voltage (predetermined voltage).

When the result in S20 is YES, i.e., when the internal voltage is determined to be greater than the protection voltage, the program goes to S22, in which the regenerative resistance switching element 46 is turned ON to allow passage of charge current from the motor 14 to the resistor 44. The "protection voltage" here is set to a predetermined value that voltage of the driver circuit 34 is to be prevented from reaching or exceeding.

Accordingly, as explained earlier, the negative side current path 30b and the positive side current path 30a are connected, and regenerative electric current stored in the driver circuit 34 flows into and is consumed by the resistor 44, whereby internal voltage of the driver circuit 34 can be inhibited from rising excessively.

On the other hand, when the result in S20 is NO, i.e., when the detected internal voltage of the driver circuit 34 is determined to be less than the predetermined protection voltage, no problem of internal voltage rising excessively is present, so the program goes to S24, in which the regenerative resistance switching element 46 is turned OFF to block passage of charge current from the motor 14 to the resistor 44.

As stated above, the embodiment is configured to have an apparatus for controlling operation of a walk-behind electric lawn mower (10) equipped with a frame (12) configured to be movable over a lawn growth area (G) by a user (P) by hand from behind; an electric motor (14) mounted on the frame; a blade cutter (16) provided at an underneath surface of the frame to be connected to the electric motor and configured to cut grass on the lawn growth area when driven by the electric motor; a rechargeable battery (20) mounted on the frame to be connected to the electric motor and configured to discharge electric power so as to apply to the electric motor as operating electric power and to be charged by a regenerative electric current that is generated by the electric motor during regenerative braking of rotation of the blade cutter; a motor driver circuit (34) configured to adjust supply of the operating electric power to the electric motor, and a control unit (36a) configured to control operation of the motor driver circuit; characterized by: a first switching element (charge switching element 42a) disposed in a current path (30) of the motor driver circuit (34) connecting the rechargeable battery and the electric motor to allow passage of charge current from the electric motor to the rechargeable battery when turned ON and block the passage of the charging current when turned OFF; a resistor (braking resistor 44) interposed in the current path; a second switching element (regenerative resistance switching element 46) interposed in the current path in series with the resistor to allow the passage of the charge current from the electric motor to the resistor when turned ON and block the passage of the charge current when turned OFF; a rechargeable battery temperature detector (temperature sensor 20b) configured to produce an output indicating a temperature of the rechargeable battery; and an internal circuit voltage detector (voltage sensor 60) configured to produce an output indicating an internal voltage of the motor driver circuit; wherein the control unit (36a) configured to control ON/OFF of the first and second switching elements based on the outputs of the rechargeable battery temperature detector and the internal circuit voltage detector.

More precisely, the apparatus further includes an electronic control unit (36) having at least one processor (CPU 36a) and a memory (36b) coupled to the CPU, wherein the processor is configured to perform as the control unit (36a).

With this, by, for example, controlling ON/OFF action of the first switching element 42a to block passage of charge current (regenerative current) to the rechargeable battery 20 when detected rechargeable battery temperature is low, degradation of rechargeable battery characteristics can be avoided, whereby hindrance to charging of the rechargeable battery 20 can be reliably avoided.

Moreover, by, for example, controlling ON/OFF action of the second switching element 46 to allow passage of charge current (regenerative current) to the resistor 44 when detected internal voltage of the motor driver circuit 34 exceeds the protection voltage, internal voltage of the motor driver circuit 34 can be prevented from rising excessively by passing current to the resistor 44.

In addition, controlling ON/OFF action of the first and second switching elements 42a, 46 enables selection of whether or not regenerative electric current generated by the electric motor 14 is returned to the rechargeable battery 20 to be easily made in accordance with state of the rechargeable battery 20.

Further, even when the regenerative electric current cannot be returned to the rechargeable battery 20, internal voltage of the motor driver circuit 34 can be prevented from rising excessively by, for example, allowing passage of the current to the resistor 44, so that braking force can be reliably obtained regardless of the state of the rechargeable battery 20 even when no mechanical brake is installed.

In the apparatus, the control unit turns ON the first switching element (42a) to allow passage of the charge current from the electric motor to the rechargeable battery when the temperature of the rechargeable battery detected from the output of the rechargeable battery temperature detector is equal to or higher than a predetermined temperature, and turns OFF the first switching element (42a) to block the passage of the charge current from the electric motor to the rechargeable battery when the detected temperature of the rechargeable battery is lower than the predetermined temperature.

With this, in addition to the effects and advantages mentioned above, it becomes possible to charge the battery 20 definitely by allowing the charge current when the battery 20 is rechargeable.

In the apparatus, the control unit turns ON the second switching element (46) to allow passage of the charge current from the electric motor to the resistor when the internal voltage of the motor driver circuit detected from the output of the internal circuit voltage detector is equal to or greater than a predetermined voltage, and turns OFF the second switching element (46) to block the passage of the charge current from the electric motor to the resistor when the detected internal voltage of the motor driver circuit is lower than the predetermined voltage.

With this, in addition to the effects and advantages mentioned above, even when the regenerative electric current cannot be returned to the rechargeable battery 20, internal voltage of the motor driver circuit 34 can be prevented from rising excessively by, for example, allowing passage of the current to the resistor 44, so that braking force can be reliably obtained regardless of the state of the rechargeable battery 20 even when no mechanical brake is installed.

The apparatus further includes: a rechargeable battery residual capacity detector (20c) configured to produce an output indicating a residual capacity of the rechargeable battery; wherein the control unit turns ON the first switching element (42a) to allow passage of the charge current from the electric motor to the rechargeable battery when the residual capacity of the rechargeable battery detected from the output of the rechargeable battery residual capacity detector is less than a predetermined capacity, and turns OFF the first switching element (42a) to block the passage of the charge current from the electric motor to the rechargeable battery when the detected residual capacity of the rechargeable battery is equal to or greater than the predetermined capacity.

With this, in addition to the effects and advantages mentioned above, it becomes possible to charge the battery 20 definitely by allowing the charge current when the battery 20 is rechargeable.

In the apparatus, the rechargeable battery (20) comprises a lithium-ion battery.

With this, in addition to the advantages and effects mentioned above, it becomes possible to enhance higher energy density compared to that of the common lead battery It should be noted in the above, although the invention is described with reference to a walk-behind electric lawn mower, the invention can be applied to any other type of utility vehicles.

While the present invention has been described with reference to the preferred embodiments thereof, it will be understood, by those skilled in the art, that various changes and modifications may be made thereto without departing from the scope of the appended claims.

What is claimed is:

1. An apparatus for controlling operation of a walk-behind electric lawn mower equipped with,
    a frame configured to be movable over a lawn growth area by a user by hand from behind;
    an electric motor mounted on the frame;
    a blade cutter provided at an underneath surface of the frame to be connected to the electric motor and configured to cut grass on the lawn growth area when driven by the electric motor;
    a rechargeable battery mounted on the frame to be connected to the electric motor and configured to discharge electric power so as to apply to the electric motor as operating electric power and to be charged by a regenerative electric current that is generated by the electric motor during regenerative braking of rotation of the blade cutter;
    a motor driver circuit configured to adjust supply of the operating electric power to the electric motor, and
    a control unit configured to control operation of the motor driver circuit;
    the improvement comprises
    a first switching element disposed in a current path connecting the rechargeable battery and the electric motor to allow passage of charge current from the electric motor to the rechargeable battery when turned ON and block the passage of the charging current when turned OFF;
    a resistor interposed in the current path;
    a second switching element interposed in the current path in series with the resistor to allow the passage of the charge current from the electric motor to the resistor when turned ON and block the passage of the charge current when turned OFF;
    a rechargeable battery temperature detector configured to produce an output indicating a temperature of the rechargeable battery; and
    an internal circuit voltage detector configured to produce an output indicating an internal voltage of the motor driver circuit;
    wherein the control unit configured to control ON/OFF of the first and second switching elements based on the outputs of the rechargeable battery temperature detector and the internal circuit voltage detector.

2. The apparatus according to claim 1, wherein the control unit turns ON the first switching element to allow passage of the charge current from the electric motor to the rechargeable battery when the temperature of the rechargeable battery detected from the output of the rechargeable battery temperature detector is equal to or higher than a predetermined temperature, and turns OFF the first switching element to block the passage of the charge current from the electric motor to the rechargeable battery when the detected temperature of the rechargeable battery is lower than the predetermined temperature.

3. The apparatus according to claim 1, wherein the control unit turns ON the second switching element to allow passage of the charge current from the electric motor to the resistor when the internal voltage of the motor driver circuit detected from the output of the internal circuit voltage detector is equal to or greater than a predetermined voltage, and turns OFF the second switching element to block the passage of the charge current from the electric motor to the resistor when the detected internal voltage of the motor driver circuit is lower than the predetermined voltage.

4. The apparatus according to claim 1, further including:
a rechargeable battery residual capacity detector configured to produce an output indicating a residual capacity of the rechargeable battery;
wherein the control unit turns ON the first switching element to allow passage of the charge current from the electric motor to the rechargeable battery when the residual capacity of the rechargeable battery detected from the output of the rechargeable battery residual capacity detector is less than a predetermined capacity, and turns OFF the first switching element to block the passage of the charge current from the electric motor to the rechargeable battery when the detected residual capacity of the rechargeable battery is equal to or greater than the predetermined capacity.

5. The apparatus according to claim 1, wherein the rechargeable battery comprises a lithium-ion battery.

6. An apparatus for controlling operation of a walk-behind electric lawn mower equipped with,
a frame configured to be movable over a lawn growth area by a user by hand from behind;
an electric motor mounted on the frame;
a blade cutter provided at an underneath surface of the frame to be connected to the electric motor and configured to cut grass on the lawn growth area when driven by the electric motor;
a rechargeable battery mounted on the frame to be connected to the electric motor and configured to discharge electric power so as to apply to the electric motor as operating electric power and to be charged by a regenerative electric current that is generated by the electric motor during regenerative braking of rotation of the blade cutter;
a motor driver circuit configured to adjust supply of the operating electric power to the electric motor, and
an electronic control unit having at least one processor and a memory coupled to the processor, and configured to control operation of the motor driver circuit,
wherein the improvement comprises:
a first switching element disposed in a current path connecting the rechargeable battery and the electric motor to allow passage of charge current from the electric motor to the rechargeable battery when turned ON and block the passage of the charging current when turned OFF;
a resistor interposed in the current path;

a second switching element interposed in the current path in series with the resistor to allow the passage of the charge current from the electric motor to the resistor when turned ON and block the passage of the charge current when turned OFF;
a rechargeable battery temperature detector configured to produce an output indicating a temperature of the rechargeable battery; and
an internal circuit voltage detector configured to produce an output indicating an internal voltage of the motor driver circuit;
wherein the processor of the control unit is configured to control ON/OFF of the first and second switching elements based on the outputs of the rechargeable battery temperature detector and the internal circuit voltage detector.

7. The apparatus according to claim 6, wherein the processor of the control unit is configured to turn ON the first switching element to allow passage of the charge current from the electric motor to the rechargeable battery when the temperature of the rechargeable battery detected from the output of the rechargeable battery temperature detector is equal to or higher than a predetermined temperature, and turn OFF the first switching element to block the passage of the charge current from the electric motor to the rechargeable battery when the detected temperature of the rechargeable battery is lower than the predetermined temperature.

8. The apparatus according to claim 6, wherein the processor of the control unit is configured to turn ON the second switching element to allow passage of the charge current from the electric motor to the resistor when the internal voltage of the motor driver circuit detected from the output of the internal circuit voltage detector is equal to or greater than a predetermined voltage, and turn OFF the second switching element to block the passage of the charge current from the electric motor to the resistor when the detected internal voltage of the motor driver circuit is lower than the predetermined voltage.

9. The apparatus according to claim 6, further including:
a rechargeable battery residual capacity detector configured to produce an output indicating a residual capacity of the rechargeable battery;
wherein the processor of the control unit is configured to turn ON the first switching element to allow passage of the charge current from the electric motor to the rechargeable battery when the residual capacity of the rechargeable battery detected from the output of the rechargeable battery residual capacity detector is less than a predetermined capacity, and turn OFF the first switching element to block the passage of the charge current from the electric motor to the rechargeable battery when the detected residual capacity of the rechargeable battery is equal to or greater than the predetermined capacity.

10. The apparatus according to claim 6, wherein the rechargeable battery comprises a lithium-ion battery.

* * * * *